United States Patent [19]
Kim et al.

[11] Patent Number: 5,550,642
[45] Date of Patent: Aug. 27, 1996

[54] VCR CONTROL OF A CABLE CONVERTER UNIT

[75] Inventors: Sung J. Kim, Fishers; Alfred J. Schick, Indianapolis, both of Ind.

[73] Assignee: Thomson Consumer Electronics, Inc., Indianapolis, Ind.

[21] Appl. No.: 343,265

[22] Filed: Nov. 21, 1994

Related U.S. Application Data

[63] Continuation of Ser. No. 205,755, Mar. 4, 1994, abandoned, which is a continuation of Ser. No. 806,917, Dec. 13, 1991, abandoned.

[51] Int. Cl.⁶ .................................................. H04N 5/76
[52] U.S. Cl. .................... 358/335; 360/33.1; 348/731; 348/734
[58] Field of Search .......................... 358/335, 310; 360/33.1; 348/731, 734; 455/4.1, 4.2; H04N 5/76

[56] References Cited

U.S. PATENT DOCUMENTS

| | | | |
|---|---|---|---|
| 4,337,486 | 6/1982 | Akutsu et al. | 358/191.1 |
| 5,034,820 | 7/1991 | Cho | 358/192.1 |
| 5,081,534 | 1/1992 | Geiger et al. | 358/194.1 |
| 5,123,046 | 6/1992 | Levine | 380/10 |
| 5,307,173 | 4/1994 | Yuen et al. | 358/335 |

FOREIGN PATENT DOCUMENTS

| | | | |
|---|---|---|---|
| 2251146 | 6/1992 | United Kingdom | H04B 1/18 |

Primary Examiner—Thai Q. Tran
Assistant Examiner—Khoi Truong
Attorney, Agent, or Firm—Joseph S. Tripoli; Peter M. Emanuel; Thomas F. Lenihan

[57] ABSTRACT

A VCR includes circuitry for controlling a cable converter unit, circuitry for detecting the presence of a television signal, and control code transmission circuitry for remotely controlling a cable converter unit. Advantageously, because the VCR is coupled to the output of the cable converter unit, the VCR can monitor the television signals received from the cable converter unit to ensure that commands sent to the cable converter unit from the VCR are executed. It is herein recognized that a skip list programmed into a VCR may be used by the VCR to control a cable box. That is, in response to a channel up command received by the VCR, the VCR would not change channels itself, but rather controls the cable box to select the next preferred channel entered in the skip list of the VCR. In this mode of operation, the channel tuning keys (e.g., CHAN UP, CHAN DN) of the VCR remote control are used to control an external source of signals, while the VCR mechanism control keys (e.g., PLAY, STOP, RECORD, FAST FORWARD) control the operation of the VCR. It is further recognized that those portions of the VCR concerned with channel tuning should receive power from the standby power supply normally provided for powering the IR receiver.

8 Claims, 2 Drawing Sheets

VCR CONTROL OF A CABLE CONVERTER UNIT

This is a continuation of application Ser. No. 08/205,755, filed Mar. 4, 1994, abandoned, which is a continuation of Ser. No. 806,917, filed Dec. 12, 1991, now abandoned.

FIELD OF THE INVENTION

The subject application concerns the field of videocassette recorders (VCRs) and apparatus for programming them.

CROSS REFERENCE TO RELATED APPLICATIONS

The subject patent application is related to U.S. Pat. Nos. 5,303,063 issued Apr. 12, 1994, and 5,329,376 issued Jul. 12, 1994, and to U.S. patent applications bearing Ser. Nos. 132,496 filed Oct. 6, 1993, 306,894 filed Sep. 15, 1994, and 197,581 filed Feb. 17, 1994 (now allowed), and assigned to the same assignee as the subject invention.

BACKGROUND OF THE INVENTION

When a television set owner is a subscriber to a cable television system and also possesses a videocassette recorder (VCR), he may be required to connect to the cable system via a cable decoder box (also called a CATV converter, or a set-top converter). This connection may be required, because in these systems, many cable channels (i.e., the so-called premium channels) are scrambled (i.e., encoded or encrypted) and must be descrambled (i.e., decoded or decrypted) in the cable box. The cable box descrambles the premium channel and converts its RF carrier frequency from its assigned cable channel frequency to a cable box output frequency, normally that of channel 2, 3, 4, or 5 for reception and recording by the VCR, or display by the television receiver. In such an arrangement the viewer may have as many as three remote control units for controlling the video equipment (i.e., one each for a television set, a VCR, and the cable box). If a user wants to change channels via the tuner of his cable box but inadvertently operates the remote control for the VCR, the VCR will tune away from the output channel of the cable box, causing loss of signal to the VCR, and most probably, also causing a great deal of confusion, especially to a non-technically-trained user.

A second problem arises in connection with lists of preferred channels. It is common practice to include lists of preferred channels in television receivers (TVs) and VCRs. In response to a CHANNEL UP or CHANNEL DOWN command, the TV or VCR skips non-preferred channels and tunes a preferred channel which is next higher or next lower in frequency from the currently-tuned channel. Many skip lists are automatically programmed via an autoprogram feature which steps through all possible channels and programs the skip list with information concerning whether or not each channel is active. Channels not detected in the autoprogram operation may be added by a user via operation of an ADD key. Channels which were detected and stored in the skip list but which nevertheless are not preferred by a user may be deleted from the skip list by operation of a DELETE key. Unfortunately, cable boxes normally do not perform an autoprogramming operation, and do not include skip lists. Thus, confusion arises because, a CHANNEL UP command sent to a VCR will cause the tuning of the next active or preferred channel, while a CHANNEL UP command sent to a cable box will cause the selection of the next higher channel whether that channel is active or not.

It is herein recognized that a further problem arises in that a viewer may not want to leave his VCR powered-up whenever he is watching television shows from his cable system. That is, most viewers only turn on the VCR when they are about to record or play back a videotape. Thus, locating the autoprogramming skip list in a conventional VCR would force the user to turn on the VCR in order to access the feature of skipping undesired channels during channel scans.

SUMMARY OF THE INVENTION

A VCR includes means for controlling a cable converter unit, means for detecting the presence of a television signal, and control code transmission means for remotely controlling a cable converter unit. Advantageously, because the VCR is coupled to the output of the cable converter unit, the VCR can monitor the television signals received from the cable converter unit to ensure that commands sent to the cable converter unit from the VCR are executed. It is herein recognized that a skip list programmed into a VCR may be used by the VCR to control a cable box. That is, in response to a channel up command received by the VCR, the tuner of the VCR would not change channels itself, but rather the VCR controller controls the cable box to select the next preferred channel entered in the skip list of the VCR. In this mode of operation, the channel tuning keys (e.g., CHAN UP, CHAN DN) of the VCR remote control are used to control an external source of signals, while the VCR mechanism control keys (e.g., PLAY, RECORD, FAST FORWARD) control the operation of the VCR. It is further recognized that those portions of the VCR concerned with channel tuning should receive power from the standby power supply normally provided for powering the IR receiver.

DETAILED DESCRIPTION OF THE EMBODIMENT

Figure 1:
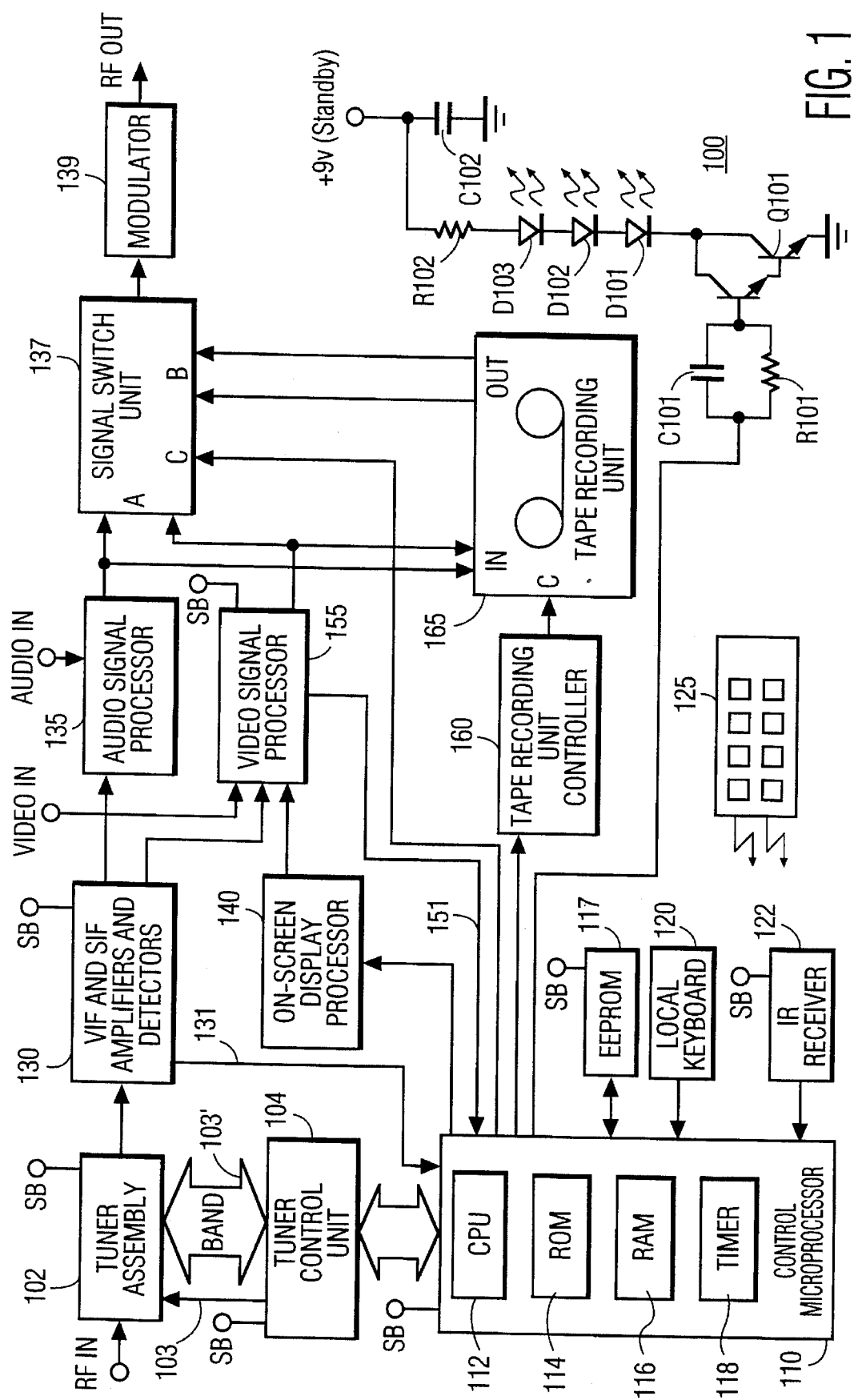
FIG. 1 shows, in block diagram form, a VCR incorporating the subject invention.

Referring to FIG. 1, radio frequency (RF) signals are applied to an RF input terminal of a tuner assembly 102. Tuner assembly 102 selects a particular RF signal under control of a tuner control unit 104 which applies a tuning control signal to tuner assembly 102 via a wire 103, and applies bandswitching signals via a control bus 103'. Tuner control unit 104 is controlled by a controller 110. Controller 110, which may be a microprocessor or microcomputer, includes a central processing unit (CPU) 112, a read-only memory (ROM) 114, a random access memory 116, and an external electrically-erasable read only memory (EEPROM) 117. Controller 110 generates a control signal for causing tuner control unit 104 to control tuner 102 to select a particular RF signal, in response to user-entered control signals from a local keyboard 120 and from an infrared (IR) receiver 122. IR receiver 122 receives and decodes remote control signals transmitted by a remote control unit 125.

Tuner 102 produces a signal at an intermediate frequency (IF) and applies it to a processing unit 130 comprising a video IF (VIF) amplifying stage, an AFT circuit, a video detector, and a sound IF (SIF) amplifying stage. Processing unit 130 produces a first baseband composite video signal (TV), and a sound carrier signal. The sound carrier signal is applied to an audio signal processor unit 135 which includes an audio detector and may include a stereo decoder. Audio signal processor unit 135 produces a first baseband audio signal and applies it to a signal switch unit 137. Second baseband composite video signals and second baseband audio signals may be applied to VIDEO IN and AUDIO IN terminals from an external source.

The first and second baseband video signals (TV) are coupled to a video processor unit 155 (having a selection circuit not shown) and is also applied to signal switch unit 137. Video and audio signals are also applied to a tape recorder unit 165 which causes the signals to be recorded onto video tape. Tape recorder unit 165 has a control input and operates under control of a tape recorder unit controller 160, which may be a microprocessor. Tape recorder unit controller 160 is in turn controlled by control signals from controller 110. Under control of controller 110, an on-screen display processor 140 generates character signals, and applies them to a second input of video signal processor 155, for inclusion in the processed video signal. Signal switch unit 137 is controlled by controller 110 via a control input terminal C to select audio and video signals from audio signal processor 135 and video signal processor 155, or from the output terminals of tape recording unit 165 in the playback mode, and to apply the selected signals to a modulator 139 for modulation onto a particular channel frequency carrier, typically that of channel 3 or channel 4. The circuitry described thus far is known from RCA videocassette recorder model VR520.

Unlike the RCA VR520, which has as its main programming feature a TIMER PROGRAM mode of operation, apparatus according to the subject invention may include both a TIMER PROGRAM programming feature and a VCR PLUS™ programming feature. The control program for the above-mentioned features resides in ROM 114 of controller 110. Electrically-erasable programmable read only memory (EEPROM) 117 is coupled to controller 110, and serves as a non-volatile storage element for storing autoprogramming channel data, user-entered channel data, and VCR PLUS™ channel mapping data.

An IR LED driver circuit, generally, designated 100, is coupled to controller 110, for providing IR signals to external units, such as a cable box for a cable TV service. IR LED driver circuit comprises a filter capacitor C102, a current-limiting resistor R102, three series-connected IR LEDs (infrared light emitting diodes) D101, D102, and D103, a darlington-connected transistor switch Q101, a base resistor R101, and a speed-up capacitor C101.

Processing unit 130 also produces an IF AGC signal which is coupled to controller 110 via a wire 131, for detection of variation of the signal strength of signals of currently-tuned channels, the changes being indicative of channel changes. Alternatively, video signal processor 155 produces a valid sync detection signal or a video AGC signal which is coupled to controller 110 via a wire 151, for detection of channel changes.

It is herein recognized that in a system in which the VCR relays commands to the cable box, user confusion caused by operating the wrong remote control can be greatly reduced. Copending U.S. patent application bearing attorney docket number RCA 86,462, describes a VCR which controls a cable box and monitors an internal VCR signal to ensure that the commands sent to the cable box were received and executed. It is herein recognized that in such a system, an autoprogramming function can be implemented in which the cable box is controlled to select each channel in sequence, and the VCR examines the received signal to determine if the channel to which the cable box is tuned is an active channel. If so, the VCR enters it in its list of preferred channels, if not, the cable box is directed to tune the next channel in sequence. It is herein recognized that for three reasons, it is a clear advantage for a unit which contains a channel skip list (i.e., the VCR) to control the cable box. First, in general, cable boxes do not include lists of preferred channels (sometimes known as skip lists), and this would add the feature without modifying the cable box. Second, uniformity of operation would be introduced in that a CHANNEL UP or CHANNEL DN command would have the same effect whether the cable box (via the VCR) or VCR were being controlled. Third, if the user were to attempt to change channels via the remote control unit of the VCR, the cable box channel would be changed to the next active channel, and no confusion would result (i.e, the VCR would not tune away from the cable box output channel, as is the case with conventional VCRs).

Apparatus in accordance with the subject invention controls the cable box (i.e., the source of its own video input signals), and monitors the television signals received from the cable box, in a "closed loop" manner. By monitoring the IF AGC signal on line 131 of FIG. 1, controller 110 can detect perturbations of the signal level which indicate that the cable box has changed channels. That is, the output signal of the cable box remodulated on, for example, the RF carrier frequency of channel 3, will be momentarily lost during the period in which the cable box changes channels. Thus, the subject apparatus can determine if a channel change has occurred. It is also recognized that other signals (such as a "Valid Sync Detect" signal or a video AGC signal on line 151 of FIG. 1) can also be monitored to provide this feedback information as to whether commands transmitted to the cable box have actually been received and executed. Advantageously, if a signal which tracks a characteristic of the baseband video signal (such as Valid Sync Detect or video AGC) is used for detecting loss of signal during channel change, then the subject invention is applicable to use with cable boxes which produce decoded cable television signals at baseband rather than remodulating them to a particular television channel frequency.

It is herein recognized that It would be desirable to control the cable box via the VCR remote control circuitry, and thus gain the benefits of autoprogramming associated with use of the VCR skip list, even when the VCR is "turned off". In this way, a user who operates his VCR remote control unit, would have the proper command passed to the cable box, even though the VCR is "off", without having to perform the separate step of turning the VCR "on".

Note from FIG. 1, that TUNER ASSEMBLY 102, TUNER CONTROL UNIT 104, CONTROLLER 110, EEPROM 117, VIF AND SIF AMPLIFIERS AND DETECTOR UNIT 130, VIDEO SIGNAL PROCESSOR 155, IR RECEIVER 122, AND IR TRANSMITTER CIRCUIT 100, are all powered from a standby power supply, not shown. All the units mentioned above are concerned with channel selection or transmission of IR commands to the cable box. Powering those units from the standby power supply will enable those units to remain active even when the VCR appears to be "off". Thus, channel-related commands received by the IR receiver will be translated to the proper remote control command code format by controller 110, and transmitted to the cable box via IR transmitter circuit 100.

Figure 2A:
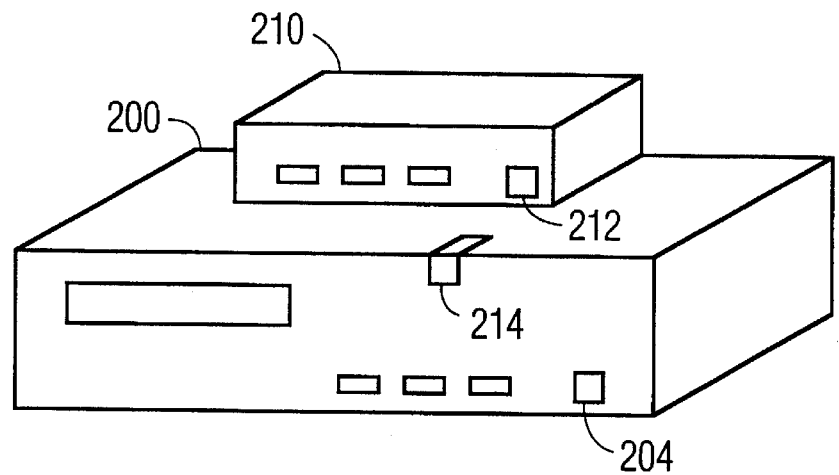
FIGS. 2a and 2b are views of a VCR incorporating the invention.
Figure 2B:
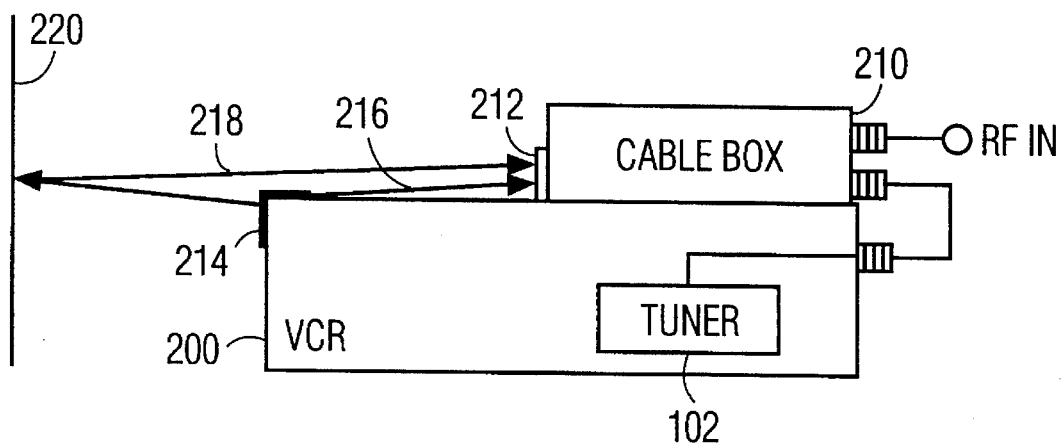

FIG. 2a is a perspective view of a cable box 210 placed VCR 200 having a, In FIG. 2b, VCR 200 is shown coupled to the RF input via cable box 210. Tuner 102 of FIG. 2b is the same tuner unit 102 previously described with respect to FIG. 1. Tuner 102 of FIG. 2b is the same tuner unit 102 previously described with respect to FIG. 1. It is common practice for cable television services to encode (i.e., scramble) at least their "Premium" channels. FIG. 2b is a configuration which may be used when some or all of the television channels provided by the cable television service are encoded in some fashion (i.e., a cable box is required for decoding). In such a configuration, the VCR will be set to record all television programs on the cable box output channel (typically, channel 2, 3, or 4). Cable box 210 of FIGS. 2a and 2b includes a window 212 for admitting an IR (infrared) remote control signal for turning the cable box on and off, and for causing the tuner of the cable box to change channels. VCR 200 of FIG. 2a includes a window 204 for admitting an IR (infrared) remote control signal for turning the VCR on and off, for causing the tuner 102 of the VCR to change channels, and for controlling the recording and playback of videotapes. VCR 200 also includes a window 214 through which IR signals generated by the VCR are transmitted to external units such as cable box 210. Note from FIG. 2b that cable box 210 preferably receives IR signals from window 214 of VCR 200 along a rearward directed path 216, and from a "bounce" path 218 in which the IR signals may be reflected from a wall or other object 220. The "bounce" path is provided for the case in which the user chooses not to place the cable box on top of the VCR.

Copending U.S. patent application bearing attorney docket number RCA 86,548, herein incorporated by reference, describes a system in which whenever the VCR is coupled to a cable box, and programmed for controlling the cable box, VCR remote control unit 125 is treated as if the VCR mechanism keys (e.g., FAST FORWARD, REWIND, STOP, PLAY, RECORD) were to control the VCR, but the tuner control keys (CHAN UP, CHAN DN, and NUMBER KEYS) were to control the cable box. Copending U.S. patent application bearing attorney docket number RCA 86,660, also herein incorporated by reference, describes a system in which the specific kind of cable box connected to the VCR is automatically determined, in order that the proper control code format may be used to send channel change commands from the VCR to the cable box.

Although the VCR PLUS™ system is referred to in the subject specification, it is herein recognized that the subject invention does not require the use of the VCR PLUS™ system and is extremely useful with standard timer recording.

What is claimed is:

1. A videocassette recorder, comprising:

a first power supply subject to being energized and deenergized for providing operating power when energized, said videocassette recorder being in an on-state when said first power supply is energized, and said videocassette recorder being in an off-state when said first power supply is deenergized;

a second power supply for providing standby power so long as said videocassette recorder is connected to an external AC power line;

a radio frequency (RF) signal input terminal, for receiving a particular RF signal from an external source of RF signals, said external source of RF signals including a first tuner means for tuning television channels and providing a selected channel as said particular RF signal;

said videocassette further including second tuner means coupled to said RF signal input terminal for receiving said particular RF signal, said second tuner means tuning said particular RF signal in response to a control signal control means for generating said control signal for causing said second tuner means to tune said particular RF signal;

means, coupled to said control means, for receiving remote control signals from a remote control unit;

means, coupled to said control means, for entering data in response to operation by a user; and means coupled to said control means for transmitting remote control signals for controlling said external source of said RF signals;

said control means in response to data entered by said user or in response to said remote control signals from said remote control unit generates said remote control signals and applies said remote control signals to said remote control signal transmitting means;

said second tuner means, said control means, said transmitting means, and said means for entering data being coupled to said second power supply for receiving standby power from said second power supply;

said transmitting means transmitting said remote control signals to said external source of said RF signals when said videocassette recorder is in said on-state and when said videocassette recorder is in said off-state;

said videocassette recorder, while in said off state, receives said remote control commands for controlling said external source of video signals, and also while in said off state, passes said remote control commands to said external source of video signals.

2. The videocassette recorder of claim 1, wherein said means for transmitting is an IR LED assembly, and said remote control signals are IR signals.

3. The videocassette recorder of claim 1, further comprising:

means for storing data corresponding to said commands for controlling said particular RF signal source, said storing means being coupled to said control means.

4. A videocassette recorder, comprising:

a baseband video signal input terminal, for receiving a particular baseband video signal from an external source of baseband video signals, said external source of baseband video signals including a tuner means for tuning television channels and providing a selected channel as said particular baseband video signal;

a first power supply subject to being energized and deenergized for providing operating power when energized, said videocassette recorder being in an on-state when said first power supply is energized, and said videocassette recorder being in an off-state when said first power supply is deenergized;

a second power supply for providing standby power so long as said videocassette recorder is connected to an external AC power line;

control means for generating control signals;

means, coupled to said control means, for receiving remote control commands sent in response to operation by a user; and means coupled to said control means for transmitting remote control signals for controlling said external source of said baseband video signals;

said control means in response to said remote control commands sent by said user generates said remote control signals and applies said remote control signals to said remote control signal transmitting means;

said control means, said transmitting means, and said means for entering data being coupled to said second power supply for receiving standby power from said second power supply;

said transmitting means transmitting said remote control signals to said external source of said baseband video signals when said videocassette recorder is in said on-state and when said videocassette recorder is in said off-state;

said videocassette recorder, while in said off state, receives said remote control commands for controlling said external source of video signals, and also while in said off state, passes said remote control commands to said external source of video signals.

5. The videocassette recorder of claim 4, wherein said means for transmitting is an IR LED assembly, and said remote control signals are IR signals.

6. The videocassette recorder of claim 4, further comprising:

means for storing data corresponding to said commands for controlling said external video signal source, said storing means being coupled to said control means.

7. A videocassette recorder, comprising:

a first power supply subject to being energized and deenergized for providing operating power when energized, said videocassette recorder being in an on-state when said first power supply is energized, and said videocassette recorder being in an off-state when said first power supply is deenergized;

a second power supply for providing standby power so long as said videocassette recorder is connected to an external AC power line;

control means for generating a control signal for controlling an external apparatus;

means for receiving remote control commands for controlling said external apparatus means, coupled to said control means, for entering data in response to operation by a user; and means coupled to said control means for transmitting remote control signals for controlling said external apparatus;

said control means in response to data entered by said user or in response to received remote control commands generates said remote control signals for controlling said external apparatus and applies said remote control signals to said remote control signal transmitting means;

said control means, said remote control receiver means, said transmitting means, and said means for entering data being coupled to said second power supply for receiving standby power from said second power supply;

said transmitting means transmitting said remote control signals to said external apparatus when said videocassette recorder is in said on-state or in said off-state;

said videocassette recorder, while in said off state, receives said remote control commands for controlling said external apparatus, and also while in said off state, passes said remote control commands to said external apparatus.

8. A videocassette recorder, comprising:

a first power supply for providing operating power when energized, said first power supply being subject to being energized and deenergized, said videocassette recorder being in an on-state when said first power supply is energized, in an off-state when said first power supply is deenergized;

a second power supply for providing standby power so long as said videocassette recorder is connected to a source of power;

means for receiving remote control commands for controlling an external apparatus;

means for transmitting remote control signals for controlling an external apparatus;

said transmitting means and said receiving means being coupled to said second power supply for receiving standby power from said second power supply;

said transmitting means transmitting said remote control signals to said external apparatus when said videocassette recorder is in said on-state or in said off-state;

said videocassette recorder, while in said off state, receiving said remote control commands for controlling said external apparatus, and also while in said off state, passing said remote control commands to said external apparatus.

* * * * *